United States Patent
Dion et al.

(10) Patent No.: US 7,008,864 B2
(45) Date of Patent: Mar. 7, 2006

(54) METHOD OF DEPOSITING HIGH-QUALITY SIGE ON SIGE SUBSTRATES

(75) Inventors: Michel Maurice Dion, Gloucester (CA); Hugues Lafontaine, Ottawa (CA)

(73) Assignee: Sige Semiconductor Inc., Ottawa (CA)

( * ) Notice: Subject to any disclaimer, the term of this patent is extended or adjusted under 35 U.S.C. 154(b) by 0 days.

(21) Appl. No.: 10/493,603

(22) PCT Filed: Oct. 25, 2002

(86) PCT No.: PCT/CA02/01608

§ 371 (c)(1),
(2), (4) Date: Oct. 18, 2004

(87) PCT Pub. No.: WO03/036698

PCT Pub. Date: May 1, 2003

(65) Prior Publication Data

US 2005/0070076 A1    Mar. 31, 2005

Related U.S. Application Data

(60) Provisional application No. 60/330,662, filed on Oct. 26, 2001.

(51) Int. Cl.
*H01L 21/20*    (2006.01)
*H01L 21/36*    (2006.01)

(52) U.S. Cl. ..................... 438/483; 438/478
(58) Field of Classification Search ............... 438/478, 438/483
See application file for complete search history.

(56) References Cited

U.S. PATENT DOCUMENTS

| | | | |
|---|---|---|---|
| 6,169,007 B1 * | 1/2001 | Pinter .......................... 438/320 |
| 6,462,397 B1 * | 10/2002 | Ryum et al. ................. 257/565 |
| 6,559,021 B1 * | 5/2003 | Houghton et al. ........... 438/312 |
| 6,559,022 B1 * | 5/2003 | U'Ren .......................... 438/320 |
| 2002/0061627 A1 * | 5/2002 | Kovacic ....................... 438/309 |

* cited by examiner

*Primary Examiner*—Asok Kumar Sarkar

(57) ABSTRACT

This invention provides a method of depositing high-quality Si or SiGe epitaxial layers on SiGe substrates. By first depositing a thin Si seed layer on the SiGe substrate, the quality of the seed layer and of the subsequently deposited layers is greatly improved over what is obtained from depositing SiGe directly onto the SiGe substrate. Indeed, whereas the RMS surface roughness of the deposition of SiGe directly on SiGe, as measured by atomic-force microscopy (AFM), was 3–4 nm, it was more than an order of magnitude better when a thin Si seed layer was employed. This work was performed on an ultra-high-vacuum chemical vapor deposition (UHV/CVD) system; however, the same method would apply to other deposition systems such as atmospheric-pressure, low-pressure and rapid-thermal CVD.

20 Claims, 1 Drawing Sheet

METHOD OF DEPOSITING HIGH-QUALITY SIGE ON SIGE SUBSTRATES

This application claims the benefit of 60/330,662 filed Oct. 26, 2001.

FIELD OF THE INVENTION

This invention relates to the growth of silicon (Si) or SiGe (Silicon Germanium alloy) epitaxial layers on SiGe substrates.

BACKGROUND OF THE INVENTION

The introduction of silicon germanium (SiGe) epitaxial technology has allowed GaAs high-frequency (microwave) transistors to be replaced with silicon transistors in numerous applications. For example, while standard silicon bipolar transistors could not operate reliably above 1 GHz, SiGe Heterostructure Bipolar Transistors (HBT) are now beginning to appear in circuits designed to operate above 10 GHz.

However, SiGe devices fabricated on Silicon (Si) substrates are subject to a number of inherent restrictions. Due to the large lattice mismatch between silicon and germanium (Ge), an alloy SiGe layer grown on top of a silicon substrate or single-crystal surface must remain below a certain critical thickness in order to prevent relaxation through the formation of threading dislocations. Such defects can propagate through the Si and SiGe layers and cause the devices fabricated using these layers to experience high percentages of failure. Consequently, the overall yield of such a fabrication process will be far lower than would generally be acceptable in comparison to rival fabrication technologies.

Thus, control of strain in Si and SiGe layers deposited on various semiconductor surfaces is a challenging area of development and important to the fabrication of devices and circuits. Specifically, the strain in the epitaxial layer (i.e. the layer grown/deposited on the substrate) alters the electrical characteristics of the composite semiconductor material. That is, various parameters such as electron and hole mobility, energy bandgap, etc. are known to change as a result of a change in the 'built-in' strain associated with matching the atomic lattice structure of the epitaxial layer with that of the layer (e.g. the substrate or another between layer) onto which the epitaxial layer is grown.

The lattice strain within the deposited or grown layers may alter the susceptibility of the layers to various etching or dissolving solvents. In the construction of micro-mechanical devices (MEMS) strain in the deposited or grown layers and the morphology of such layers are important variables in the device commercial fabrication and yield at which devices can be successfully reproduced.

The availability of high-quality SiGe substrates would permit the development of new devices with thicker, lattice-matched SiGe, tensile-strained Si or SiGe layers, or strain-compensated Si/SiGe structures. However, a SiGe substrate would typically have an atomic spacing (lattice constant) different from the epitaxial layer grown on top of it; and, therefore growing a Si or SiGe epitaxial layer—with a different percentage of Ge—would induce different strain conditions.

Moreover, until recently, the only available SiGe substrates were virtual SiGe substrates; these are actually Si substrates with a thick, relaxed SiGe buffer. However, the defect density of virtual SiGe substrates is around $10^4$ cm$^{-2}$ which compared to single crystal silicon wafers is quite poor and, in the context of Silicon VLSI manufacturing, intolerable. In spite of this, good SiGe n-type (p-type) field-effect transistors with relatively high electron (hole) mobility have been realized on these types of substrates.

The recent commercial introduction of single-crystal SiGe substrates manufactured using the Czochralski technique, like their single crystal silicon wafer counterparts, promises to further improve device characteristics, percentage yield and to potentially allow for large-scale manufacturing of Si/SiGe FETs and HEMTs. These devices could be constructed on the aforementioned high-quality SiGe substrates having a percentage yield acceptable to the general practices and cost structures of the Si VLSI industry. This would make possible, for example, CMOS VLSI circuits, like those used in computer microprocessors and memory chips, with increased speed of operation or lower power consumption than those without SiGe. Other potential applications include novel optoelectronic devices and Ge-based thermoelectric generators.

The pitfall, thus far, has been that the epitaxial deposition of SiGe directly on SiGe substrates results in an interface between the two layers that suffers from unacceptable strain conditions and poor morphology which in turn causes lattice defects within each of the two layers; thereby significantly reducing the smoothness of the interface. Consequently, the epitaxial layer is of poor quality and uniformity, leading to a very rough surface morphology which in turn negatively impacts subsequent processing steps. It is now well established that the quality and performance of electronic devices is directly related to the smoothness of interfaces between the substrate and the epitaxial layer and between layers; the smoother the interfaces, the better the devices fabricated.

The problem of non-uniform growth or poor surface morphology (i.e. smoothness) may be compounded when growth of a SiGe epitaxial layer is to take place on a mixed-topology or patterned surface. For example, a surface with regions of oxide (silicon dioxide) and SiGe single crystal surfaces will induce different growth rates for the SiGe epitaxial layer on the different surfaces which will in turn cause the grown (or deposited) epitaxial layer to have a poor surface morphology.

Thus, there is a desire to provide a method of depositing high-quality Si or SiGe epitaxial layers on SiGe substrates in which the surfaces of the deposited layers are substantially free of lattice defects and are thus substantially uniform. Moreover, it would be desirable for the interfaces between the substrate and the deposited layers and between layers to be smooth and substantially free of lattice defects.

SUMMARY OF THE INVENTION

According to a first aspect of the invention a method of depositing at least one epitaxial layer of SiGe onto a SiGe substrate comprising firstly depositing on the SiGe substrate a thin Si seed layer and then depositing on the Si seed layer the at least one epitaxial layer of SiGe is provided.

According to a second aspect the invention provides a method of depositing at least one epitaxial layer of Si onto a SiGe substrate comprising depositing on the SiGe substrate a thin Si seed layer and then depositing on the Si seed layer the at least one epitaxial layer of Si.

Moreover, for applications that require fully strained epitaxial layers without any dislocations care must be taken to ensure that the thickness of the layer is below a certain critical thickness, whether the layer is Si or SiGe with a Ge percentage different from that of the substrate. As noted previously, above the critical thickness threading dislocations may be created that may potentially decrease the performance of devices made from such layers.

Another advantage of using a thin Si seed layer is its compatibility with growth on patterned substrates. A thin Si seed layer allows conformal growth on substrates with varied topology (single-crystal and polycrystalline Si, and silicon dioxide and nitride).

Advantageously, the method according to the invention may be used to fabricate active semiconductor devices, for example, Heterojunction Bipolar Transistors (HBT's).

Other aspects and features of the present invention will become apparent to those ordinarily skilled in the art upon review of the following description of specific embodiments of the invention in conjunction with the accompanying figures.

BRIEF DESCRIPTION OF THE DRAWING

The invention will now be described in greater detail with reference to the accompanying diagram, in which.

DETAILED DESCRIPTION OF THE PREFERRED EMBODIMENT

Figure 1:
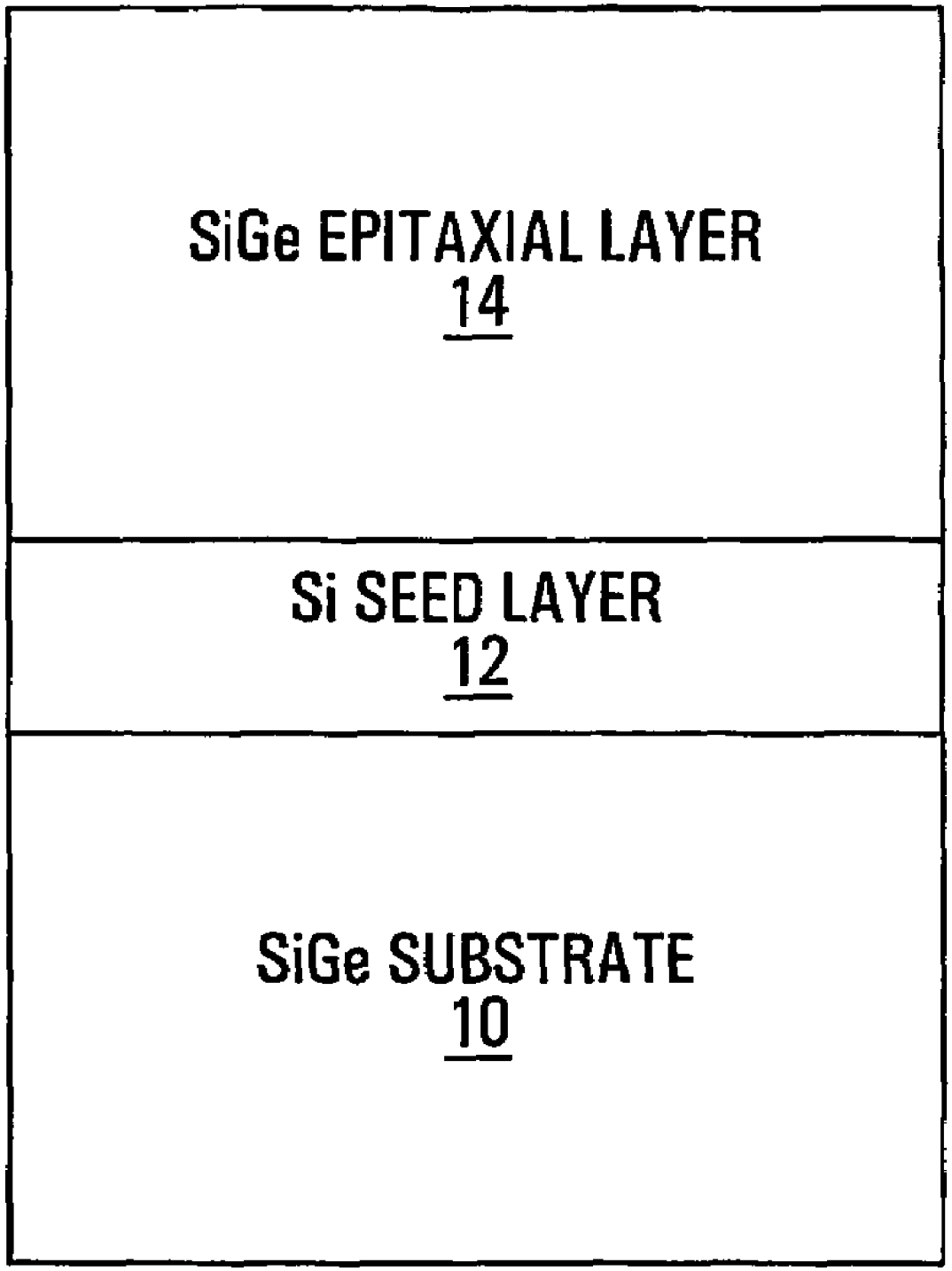
FIG. 1 is a cross-sectional view illustrating an embodiment of the invention.

This invention provides a method of depositing high-quality Si or SiGe epitaxial layers on SiGe substrates. By first depositing a thin Si seed layer on the SiGe substrate, the quality of the seed layer and of the subsequently deposited layers is greatly improved over what is obtained from depositing SiGe directly onto the SiGe substrate. Indeed, whereas the RMS surface roughness of the deposition of SiGe directly on SiGe, as measured by atomic-force microscopy (AFM), was 3–4 nm, it was more than an order of magnitude better when a thin Si seed layer was employed. This work was performed on an ultra-high-vacuum chemical vapor deposition (UHV/CVD) system; however, the same method would apply to other deposition systems such as atmospheric-pressure, low-pressure and rapid-thermal CVD.

Specifically, referring to FIG. 1, on top of a SiGe substrate 10 there is deposited a thin seed layer 12 of Si and on top of layer 12 there is deposited a layer 12 of SiGe. For the purposes of the present invention the thin seed layer 12 of Si need only be of sufficient thickness to substantially coat the SiGe substrate surface and to provide a substantially smooth surface onto which an epitaxial layer can be deposited.

The SiGe substrate 10 is unstrained and has a low number of defects. The percentage of Ge in the SiGe substrate 10 is expressed as X % where 0<X<100 and typically X=15.

With regard to the Si seed layer 12, it has a thickness t where 10 A<t<500 A; typically t=100 Angstrom units.

For the SiGe layer 14, the percentage of Ge is expressed as Y % where 0<Y<100 and typically Y=25. The SiGe layer 14 may be strained or unstrained and has a thickness t where 0 $\mu$m<t<25 $\mu$m; typically t=500 Angstrom units, strained.

Although the invention is intended primarily to permit high quality epitaxial deposition of SiGe on an SiGe substrate, the use of a thin Si seed layer can also be used to permit high quality epitaxial deposition of Si on an SiGe substrate. Moreover, the SiGe substrate may either have a SiGe single crystal surface or have a patterned surface made up of exposed regions of SiGe and, for example, silicon dioxide (oxide).

While the preferred embodiment of the present invention has been described and illustrated, it will be apparent to persons skilled in the art that numerous modifications and variations are possible. Specifically, the invention could be utilized to fabricate different devices of varying characteristics and performance. This could be done by choosing the appropriate fractional Ge content X % of the SiGe epitaxial layer in relation to the fractional Ge content Y % of the SiGe Substrate to achieve the desired effects. The choice of the amount of Germanium in the epitaxial layers relative to the substrate effectively uses the strain (or lack thereof) inherent in the grown epitaxial layer to set the electrical qualities of the epitaxial layer.

For example, growing a 10% Ge SiGe epitaxial layer on 15% Ge SiGe substrates means the grown SiGe epitaxial layer will be under stress, because the respective lattices are mismatched as a result of have different percentages of germanium. The level of stress induced (as a result of having the respective lattices mismatched) is used to alter the electrical characteristics of the grown SiGe epitaxial layer. Moreover, by growing these layers using the Si seed layer method on SiGe substrates not only does the quality of the grown epitaxial layers increases dramatically, but so does the range of % Ge (i.e. percent geranium) layers that can be grown effectively.

It would be appreciated by those skilled in the art that additional epitaxial layers could be grown above the first epitaxial layer that had been grown above the Si seed layer (with the Si seed layer grown above the SiGe substrate). Generally, a Si seed layer may be used to alleviate the stress between two adjacent SiGe crystal layers that each have a unique percentage of Germanium (Ge) in relation to one another. Recall, it was discussed previously, that two SiGe crystals with different amounts of Ge will suffer from strain at their interface due to the respective mismatched lattices of each. Clearly then, the invention is applicable to the interface between epitaxial layers, each having a different percentage of Ge, in addition to the present embodiment in which a SiGe epitaxial layer is grown (deposited) above a SiGe substrate. However, the invention is most advantageously employed when only a single Si seed layer is grown between a SiGe substrate and the first SiGe epitaxial layer and without using a Si seed layer between the first SiGe epitaxial layer and second SiGe layer, or between any other two epitaxial layers grown above the first SiGe layer.

Additionally, those skilled in the art would understand that an epitaxial layer grown above the Si seed layer provided by the invention would not necessarily have a uniform crystal structure. This could possibly occur if the Si seed layer is first deposited (grown) on top of a patterned SiGe substrate. Recall that a patterned SiGe substrate would have various exposed regions of SiGe (having a regular crystal structure) and, for example, oxide (silicon dioxide). In the case where the epitaxial layer is grown over areas not having a regular crystal structure the epitaxial layer is in danger of growing in the form of multiple small crystals (poly-crystalline material). In this instance the Si seed layer will not necessary provide a single crystal growth surface onto which an epitaxial layer can be deposited or grown. Rather, the Si seed layer simply provides a uniform (but not necessarily single crystal) surface upon which SiGe growth can "nucleate" equally over every type of surface (single crystal or not).

Advantageously, other atomic elements may be incorporated into the grown epitaxial layer, or equivalently other atomic elements may be present or deposited in the SiGe substrate. For example, those skilled in the art would appreciate that various atomic elements are used for doping the substrate or grown epitaxial layers. In addition, it may be useful to incorporate Carbon or other atomic elements to control strain, diffusion, and a host of other material properties known to those skilled in the art. SiGe with carbon has already been seen in the prior art to control diffusion of boron and control strain. These types of modifications to the grown epitaxial layer or the substrate are considered to be within the scope and spirit of the present invention.

Furthermore, in addition to improving the quality of grown epitaxial layers (both electrical and structural quality), the Si seed layer on SiGe substrates may also facilitate the reduction in time it takes to grow subsequent epitaxial layers. This is an important factor within the context of manufacturing.

Lastly, all methods and tools used for growing seed an epitaxial layers will benefit from the present invention. Specifically, the invention is applicable to the development of many different growth techniques beyond the method of UHV-CVD including a new class of systems which use optical or RF (Radio Frequency) plasma excitation of the growth surface.

What is claimed is:

1. A method of depositing at least one epitaxial layer of SiGe on to a SiGe substrate comprising firstly depositing on the SiGe substrate a thin Si seed layer and then depositing on the Si seed layer the epitaxial layer of SiGe.

2. A method according to claim 1, wherein the fraction of Ge, X %, within the SiGe substrate is different from the fraction of Ge, Y %, within the at least one SiGe epitaxial layer.

3. A method according to claim 2, wherein the seed layer has a thickness 10 A<t<500 A.

4. A method according to claim 3, wherein t=substantially 100 A.

5. A method according to claim 2, wherein the SiGe substrate has exposed regions of SiGe and oxide and the seed layer is deposited on the exposed areas of SiGe and oxide.

6. A method according to claim 2, wherein the SiGe in the SiGe substrate is doped.

7. A method according to claim 2, wherein the SiGe in the at least one SiGe epitaxial layer is doped.

8. A device formed by the method of claim 2.

9. A method according to claim 1, wherein the seed layer has a thickness 10 A<t<500 A.

10. A method according to claim 9, wherein t=substantially 100 A.

11. A method according to claim 10, wherein the SiGe substrate has exposed regions of SiGe and oxide and the seed layer is deposited on the exposed areas of SiGe and oxide.

12. A method according to claim 9, wherein the SiGe substrate has exposed regions of SiGe and oxide and the seed layer is deposited on the exposed areas of SiGe and oxide.

13. A method according to claim 9, wherein the SiGe in the SiGe substrate is doped.

14. A method according to claim 9, wherein the SiGe in the at least one SiGe epitaxial layer is doped.

15. A method according to claim 1, wherein the SiGe substrate has exposed regions of SiGe and oxide and the seed layer is deposited on the exposed areas of SiGe and oxide.

16. A method according to claim l, wherein the SiGe in the SiGe substrate is doped.

17. A method according to claim 1, wherein the SiGe in the at least one SiGe epitaxial layer is doped.

18. A device formed by the method of claim 1.

19. A method of depositing at least one Si epitaxial layer onto a SiGe substrate comprising depositing on the SiGe substrate a thin Si seed layer and then depositing on the Si seed layer the at least one Si epitaxial layer.

20. A device formed by the method of claim 19.

* * * * *